United States Patent
Meli Thompson et al.

(10) Patent No.: US 10,578,981 B2
(45) Date of Patent: *Mar. 3, 2020

(54) POST-LITHOGRAPHY DEFECT INSPECTION USING AN E-BEAM INSPECTION TOOL

(71) Applicant: International Business Machines Corporation, Armonk, NY (US)

(72) Inventors: Luciana Meli Thompson, Albany, NY (US); Ekmini A. De Silva, Slingerlands, NY (US); Yasir Sulehria, New York, NY (US); Nelson Felix, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/044,629

(22) Filed: Jul. 25, 2018

(65) Prior Publication Data

US 2020/0033733 A1 Jan. 30, 2020

(51) Int. Cl.
*G03F 7/20* (2006.01)
*H01L 21/02* (2006.01)
(Continued)

(52) U.S. Cl.
CPC .......... *G03F 7/7065* (2013.01); *C23C 16/308* (2013.01); *C23C 16/405* (2013.01);
(Continued)

(58) Field of Classification Search
None
See application file for complete search history.

(56) References Cited

U.S. PATENT DOCUMENTS

| 5,025,165 A | 6/1991 | Chen et al. |
| 5,783,366 A | 6/1998 | Chen et al. |

(Continued)

FOREIGN PATENT DOCUMENTS

| JP | 61125034 A | 6/1986 |
| JP | 03157920 A | 7/1991 |

(Continued)

OTHER PUBLICATIONS

Cheng-et al.,"Enhance Extreme UltraViolet Lithography mask inspection contrast by using Fabry-Perot type antireflective coatings," Digest of Papers Microprocesses and Nanotechnology 2003; pp. 94-95.

(Continued)

*Primary Examiner* — Shamim Ahmed
(74) *Attorney, Agent, or Firm* — Cantor Colburn LLP; Vazken Alexanian

(57) ABSTRACT

Methods for post-lithographic inspection using an e-beam inspection tool of organic extreme ultraviolet sensitive (EUV) sensitive photoresists generally includes conformal deposition of a removable metal carboxide or metal carboxynitride onto the relief image. The conformal deposition of the metal carboxide or metal carboxynitride includes a low temperature vapor deposition process of less than about 100° C. to provide a coating thickness of less than about 5 nanometers. Subsequent to e-beam inspection, the metal carboxide or metal carboxynitride coating is removed using a wet stripping process. Once stripped, the wafer can continue on to further process fabrication without being a sacrificial wafer.

15 Claims, 1 Drawing Sheet

(51) Int. Cl.
| | |
|---|---|
| *G03F 7/16* | (2006.01) |
| *C23C 16/30* | (2006.01) |
| *C23C 16/40* | (2006.01) |
| *C23C 16/455* | (2006.01) |
| *H01L 21/67* | (2006.01) |
| *H01L 21/027* | (2006.01) |
| *C23C 16/56* | (2006.01) |

(52) U.S. Cl.
CPC ........ *C23C 16/45536* (2013.01); *C23C 16/56* (2013.01); *G03F 7/16* (2013.01); *H01L 21/0206* (2013.01); *H01L 21/0228* (2013.01); *H01L 21/0273* (2013.01); *H01L 21/02172* (2013.01); *H01L 21/02274* (2013.01); *H01L 21/67288* (2013.01)

(56) References Cited

U.S. PATENT DOCUMENTS

| | | | |
|---|---|---|---|
| 6,190,062 B1* | 2/2001 | Subramanian | H01J 37/28 396/578 |
| 6,352,803 B1 | 3/2002 | Tong et al. | |
| 6,440,621 B1 | 8/2002 | Sutton et al. | |
| 6,486,946 B1 | 11/2002 | Stover et al. | |
| 6,507,474 B1* | 1/2003 | Singh | G03F 7/70616 361/212 |
| 6,537,918 B2 | 3/2003 | Ionov et al. | |
| 6,596,553 B1 | 7/2003 | Lin et al. | |
| 6,774,365 B2 | 8/2004 | Okoroanyanwu et al. | |
| 6,844,235 B1* | 1/2005 | Jones | G01N 21/95607 438/401 |
| 9,496,119 B1 | 11/2016 | De et al. | |
| 2005/0019697 A1 | 1/2005 | Tang et al. | |
| 2005/0211896 A1 | 9/2005 | Lu et al. | |
| 2008/0311283 A1 | 12/2008 | Brasack et al. | |

FOREIGN PATENT DOCUMENTS

| | | |
|---|---|---|
| JP | 2010129755 A | 6/2010 |
| JP | 2013128069 A | 6/2013 |
| KR | 1020030058669 A | 7/2003 |

OTHER PUBLICATIONS

List of IBM Patents or Patent Applications Treated as Related; (Appendix P), Date Filed Aug. 16, 2019; 2 pages.

Luciana Meli Thompson et al. Post-Lithography Defect Inspection Using an E-Beam Inspection Tool, U.S. Appl. No. 15/902,036, filed Feb. 22, 2018.

* cited by examiner

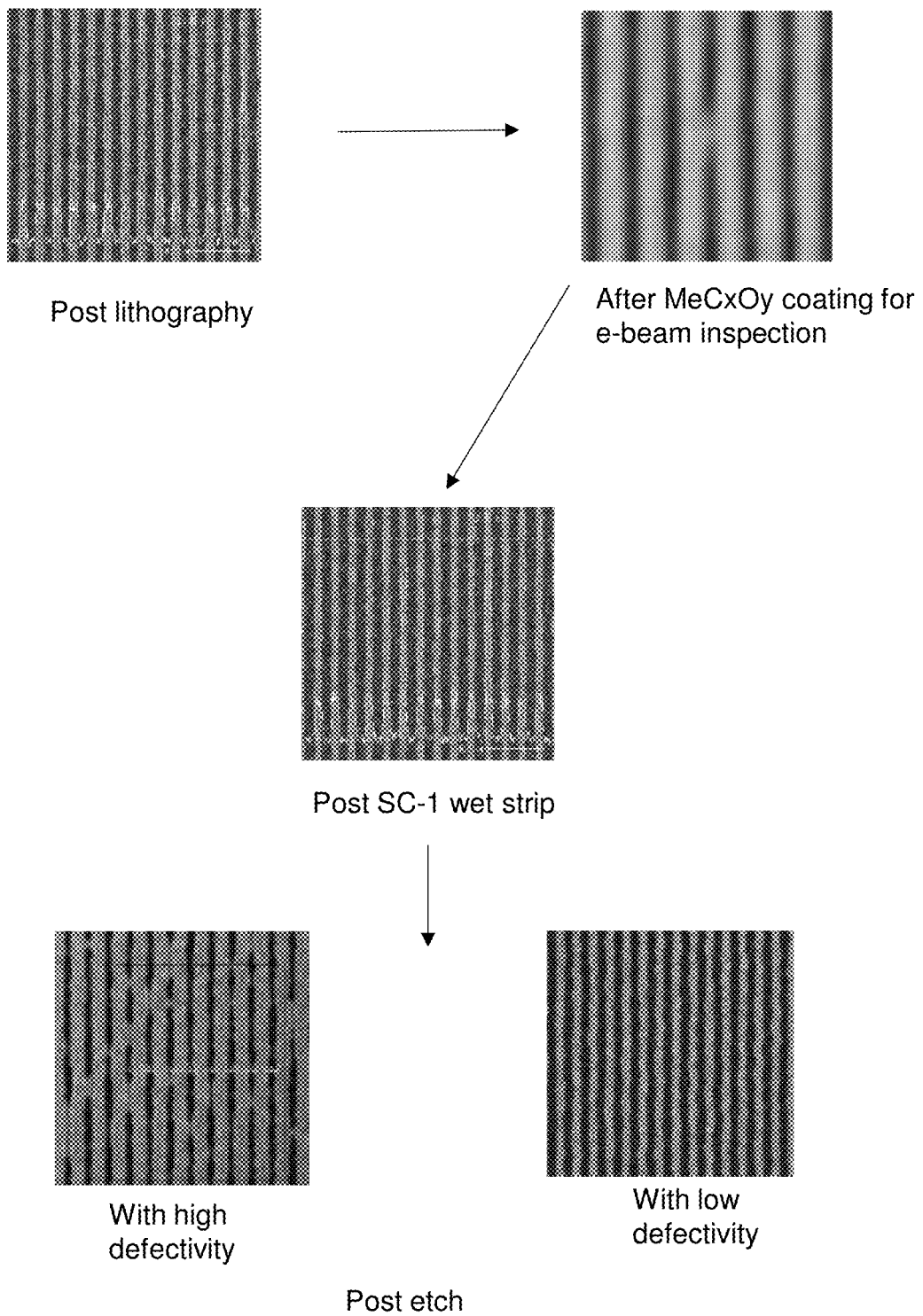

POST-LITHOGRAPHY DEFECT INSPECTION USING AN E-BEAM INSPECTION TOOL

BACKGROUND

The present invention generally relates to defect detection in semiconductor structures, and more specifically to post-lithography defect inspection using an e-beam inspection tool.

Lithography is utilized for the fabrication of semiconductor structures, such as integrated circuits and micromechanical structures. The basic process of producing a semiconductor structures involves the modification of the surface material of a semiconductor substrate, such as of silicon, in a pattern. The interplay of the material changes and the pattern defines the electrical characteristics of the microelectronic device. A similar process can be used to form micromechanical devices, by, for example, electroplating metal structures in a desired pattern onto a substrate. Lithography is used to define the pattern on the substrate, which will be doped, etched, or otherwise modified to form the microelectrical or micromechanical device.

In a basic lithography process for the fabrication of semiconductor structures, a photoresist is deposited on a substrate surface. The photoresist is sensitive to radiation, e.g., extreme ultraviolet (EUV) radiation, and, depending on the photoresist used, portions of the photoresist that are exposed to the radiation can be removed (or left remaining) by a development process. The semiconductor structure is formed by etching or otherwise modifying the substrate in the areas from which the photoresist has been removed. To form a desired pattern in the photoresist, the radiation that is used to expose the photoresist is passed through or reflected off of a lithography mask that defines the pattern that is to be transferred to the photoresist.

SUMMARY

Embodiments of the present invention are generally directed to methods for preparing a semiconductor wafer with organic extreme ultraviolet (EUV) sensitive photoresist relief images thereon for defect inspection, methods for examining a semiconductor wafer having an organic EUV photoresist relief image thereon using an e-beam inspection tool, and methods for examining a semiconductor wafer having an organic EUV photoresist relief image thereon for defects.

A non-limiting example method for preparing a semiconductor wafer with an organic EUV photoresist relief image thereon for defect inspection according to embodiments of the invention includes providing a semiconductor wafer having a relief image of an organic EUV sensitive photoresist thereon. A metal carboxide or metal carboxynitride is conformally coated onto the relief image using a vapor deposition process at a temperature of about room temperature to less than about 100° C. and at a thickness less than about 5 nanometers. The wafers are then inspected using an e-beam inspection tool.

A non-limiting example method for examining a semiconductor wafer having an organic EUV photoresist relief image thereon using an e-beam inspection tool according to embodiments of the invention includes providing a semiconductor wafer having an organic EUV photoresist relief image thereon. A metal carboxide or a metal carboxynitride is conformally coated onto the photoresist relief image using a vapor deposition process at a temperature less than about 100° C. and at a thickness less than about 5 nanometers, wherein a dielectric constant of the metal carboxide or the metal carboxynitride is greater than a dielectric constant of the organic EUV photoresist. The wafer can be introduced into an e-beam inspection tool configured to scan the wafer for defect detection.

A non-limiting example method for examining a semiconductor wafer having an organic EUV photoresist relief image thereon using an e-beam inspection tool according to embodiments of the invention includes coating an organic EUV photoresist onto a semiconductor wafer at a thickness within a range of about 30 angstroms to about 50 angstroms. A relief image of the EUV photoresist is lithographically formed, wherein the relief image includes sub-40 nm lines and spaces having a pitch ranging from 1:1 to 1000:1. A metal carboxide or a metal carboxynitride is conformally coated onto the relief image using vapor deposition at a temperature less than about 100° C. and at a thickness less than about 5 nanometers. The wafer can be introduced in an e-beam tool for inspection, and the semiconductor wafer is inspected. Inspecting the semiconductor wafer includes taking an image at a location on the semiconductor wafer by scanning the semiconductor wafer with a focused electron beam and comparing the image at the location to a reference image from another wafer location with an identical design or to a preexisting image in order to flag differences between the image at the location and the reference image or the preexisting image as a defect. The metal carboxide or the metal carboxynitride are wet stripped from the relief image. The wafer can now continue on to further process fabrication without being a sacrificial wafer.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The FIGURE depicts scanning electron micrographs of uncoated relief images formed from an organic EUV photoresist, after conformal coating with a metal carboxide for e-beam inspection, after removal of the metal carboxide coating, and after etch in accordance with embodiments of the invention.

DETAILED DESCRIPTION

The present invention generally relates to post-EUV lithography defect inspection, i.e., after development inspection of a patterned organic EUV photoresist. The post-EUV lithography defect inspection process generally includes conformally coating the patterned EUV photoresist with a thin layer of a removable metal carboxide ($MeC_xO_y$) or a removable metal carboxynitride ($MeC_xO_yN_z$) prior to defect inspection with an ebeam inspection tool. The removable metal carboxide or the removable metal carboxynitride can be selected to have a dielectric constant value greater than a dielectric constant of the EUV photoresist used to form the pattern. The metal in the removable metal carboxide (MeCxOy) or the removable metal carboxynitride is not intended to be limited and can include carboxides and carboxynitrides of titanium, hafnium, tantalum, cobalt, tungsten or the like. The removable metal carboxide or the removable metal carboxynitride is deposited at a thickness of less than 5 nanometers (nm) and can be deposited by a low temperature and conformal vapor deposition process. Advantageously, scanning electron microscope (SEM) images can be obtained that provide detection of microbridges and scumming within the patterned organic EUV photoresist, which were not readily discernable using prior processes at smaller features sizes. Moreover, the removable metal carboxide or the removable metal carboxynitride can be removed subsequent to inspection, i.e., wafer inspection is advantageously non-destructive.

An e-beam defect inspection tool, is used for localizing "defects," i.e., local abnormalities on the surface of semiconductor wafer used for fabricating integrated circuits. E-beam defect inspection tools are used in two modes. In a first mode, known as physical defect inspection, the electron beam gathers images of large enough areas to be able to capture a physical defect or abnormality of interest i.e. the defect physically appears in the area being imaged and is visible in the image created in the detector. Note that the defect need not be "clearly" visible for the inspection tool to operate. It must only generate a signal strong enough to suggest that a defect exists. Detection is accomplished automatically by comparing the image to a reference image from another wafer location with an identical design, or to a preexisting image stored on a computer, so as to flag differences between the image of the location and the reference image or the preexisting image as a defect. Once the inspector has localized the defect, the localized defect is typically used to gather higher resolution images in a review scanning electron microscope.

The thickness of prior art conductive coatings such as gold sputtered coatings were typically about 10 nm and have a grain size of about 2 to 5 nm. However, as feature sizes scale downward, the prior art of sputtering post-lithographic sub-36 nm line-space patterns, for example, with these types of conductive metals followed by SEM inspection failed to detect the presence of microbridges or scumming, which were evident from inspection of the post-etched patterned substrates. For photoresist scumming, the typical defect detection size is about 1 to 10 nm, which is smaller than the grain size the pure conductive metals used in the prior art. The present invention overcomes these problems by conformally depositing removable metal carboxide or removable metal carboxynitride onto the specimen at a thickness less than 5 nm just prior to insertion into the microscope. In one or more embodiments, the removable metal carboxide or the removable metal carboxynitride can be selected to have a higher dielectric constant than the underlying organic EUV photoresist. For example, the dielectric constant k value for a polystyrene-based organic EUV polymer commonly used in organic EUV photoresists is about 2.5 whereas the k values for the removable metal carboxides or the removable metal carboxynitrides are markedly higher at about 4.0 to as high as about 7.0. This provides an increase in thermal conductivity relative to the uncoated photoresist, allowing a discharge path to ground without disturbing the features being observed.

Detailed embodiments of the processes of the present invention for post-lithography defect inspection will now be described herein. However, it is to be understood that the embodiments of the invention described herein are merely illustrative of the structures that can be embodied in various forms. In addition, each of the examples given in connection with the various embodiments of the invention is intended to be illustrative, and not restrictive. Further, the FIGURES are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing FIGURES. The same numbers in the various FIGURES can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, can be used herein for ease of description to describe one element or feature's relationship to another element(s) or feature(s) as illustrated in the FIGURES. It will be understood that the spatially relative terms are intended to encompass different orientations of the device in use or operation in addition to the orientation depicted in the FIGURES. For example, if the device in the FIGURES is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The embodiments of the present invention can be used in connection with inspection of layers used to form semiconductor devices that could require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

In one or more embodiments, the post-EUV lithography inspection process generally includes exposing an organic EUV photoresist layer through a mask with EUV radiation to form a latent image; developing the latent image in the photoresist layer to form a pattern in the photoresist, conformally coating the patterned photoresist with the removable metal carboxide or the removable metal carboxynitride at a thickness less than 5 nm; and inspecting the patterned photoresist by e-beam inspection. The e-beam inspection can include scanning areas of the wafer where the defect might be located, and comparing the image formed to reference images. The reference images are obtained from another part of the wafer with the same design of from stored images. Differences between the images will be flagged as a defect. The inspection will thus identify residues, debris, and scum left by photoresist lithographic processing. In one or more embodiments of the invention, the thickness of the conformal coating of the removable metal carboxide or the removable metal carboxynitride is within a range of about 1 nm to about 3 nm.

The removable metal carboxide or the removable metal carboxynitride is selected to have a metal content of about 15 atomic weight percent to about 30 atomic weight percent to provide effective contrast during imaging of sub-36 nm features. The organic content, i.e., the carbon content, is generally greater than zero to less than about 20 atomic weight percent and provides post inspection wet strippability using standard clean processes such as SC-1, which generally includes exposing the conformal coating of the metal carboxide or the metal carboxynitride to an aqueous solution containing ammonium hydroxide and hydrogen peroxide. Other suitable wet etching chemistries include an aqueous solution of a buffered hydrofluoric acid, an aqueous solution of a dilute hydrofluoric acid solution, or the like. The particular wet etch chemistry is not intended to be limited. The wet strip process can be optimized by varying the components therein as well as the concentration to provide a target wet stripping rate of about 4 nm/min. The metal can be a transition metal such as, but not limited to, titanium, hafnium, tungsten, zirconium, and the like.

Table 1 below provides a comparison of various properties of prior art gold sputtered coated films to metal carboxide and metal carboxynitride coated films. As shown, the silicon derivative can be selected to have a greater dielectric constant than the exemplary polystyrene photoresist as well as provide a higher thermal conductivity, which when exposed to the low temperature vapor deposition process has been found not to affect the underlying photoresist profile, not to induce defects, and advantageously mitigate accumulation of charge on the photoresist.

TABLE 1

| | Gold Sputtering | Metal Carboxide or Metal Carboxynitride | Polystyrene-based EUV photoresist |
| --- | --- | --- | --- |
| Dielectric Constant | Conductor | 4.0 to 7.0 | 2.5 |
| Thermal Conductivity (W/m K) | 310 | 6.9 | 0.04 |
| Thickness (nm) | 5-10 | 1-5 | NA |
| Grain Size | 2-5 nm | Amorphous | NA |
| Removability | Cannot be removed, destructive | Removable | |

In operation, an organic EUV photosensitive resist layer is deposited onto a substrate, patterned and developed to form a relief image. The EUV photosensitive resist layer is not intended to be limited and can be a chemically amplified photoresist or a non-chemically amplified photoresist as is known in art. By way of example, the organic EUV photoresist can include polystyrenes, polyacrylates, derivatives thereof, copolymers thereof, terpolymers thereof, and the like.

Once the organic EUV photoresist is lithographically patterned, a thin conformal coating of the metal carboxide or the metal carboxynitride is deposited using a low temperature vapor deposition process, wherein the deposition temperature is less than 100° C. The vapor phase deposition process is not intended to be limited to any particular method. In one or more embodiments of the invention, the vapor phase deposition process can be an atomic layer deposition process ("the ALD process").

The ALD process generally refers to a process for producing thin films over a substrate molecular layer by molecular layer using self-saturating and self-limiting chemical reactions. Suitable ALD processes include, without limitation, both thermal ALD and plasma-enhanced ALD (PEALD) processes. In a typical ALD process, precursors, also called gaseous reactants, are conducted into a reaction space in a reactor where they contact a photoresist and react with the photoresist surface in a self-limiting manner. The pressure and the temperature of the reaction chamber are adjusted to a range where physisorption (i.e. condensation of gases) and thermal decomposition of the precursors are avoided. Because of steric hindrance, only up to one monolayer (i.e., an atomic layer or a molecular layer) of material is deposited at a time during each pulsing cycle. Thus, the actual growth rate of the thin film, which is typically presented as A/pulsing cycle, depends, for example, on the number of available reactive surface sites or active sites on the surface and bulkiness of the chemisorbing molecules. Gas phase reactions between the precursors and any undesired reactions of byproducts are inhibited because precursor pulses are separated from each other by time and the reaction chamber is purged with an inactive or inert gas (e.g. nitrogen, argon or hydrogen) and/or evacuated using, e.g., a pumping system between precursor pulses to remove surplus gaseous reactants and reaction byproducts from the chamber. For the plasma enhanced atomic layer deposition of the metal carboxide or the metal carboxynitride, the RF power is typically greater than about 0 to about 50 Watts (W), RF time is from about 0 to about 1 second, and temperature is about room temperature (about 21° C.) to about 75° C. In thermal atomic layer deposition, the temperature is less than 100° C. and in one or more embodiments, the temperature is from room temperature to about 50° C.

In aspects of the present invention, the precursors for forming the metal carboxide or the metal carboxynitride are introduced in the vapor phase into the reaction space of the reactor. The precursor reacts with reactive sites present on the surface of the photoresist. Because of steric hindrance, a monolayer of the reacted precursor is formed. The process can be repeated to provide additional monolayers up to a thickness of less than about 5 nm. As noted above, the dielectric constants of the metal carboxide or the metal carboxynitride can be selected to be greater than the dielectric constant of the organic photoresist being inspected. The metal carboxide or the metal carboxynitride can be deposited using a low temperature deposition process such as thermal at temperatures from about room temperature (e.g., about 20° C.) to less than about 50° C. or plasma enhanced atomic layer deposition at temperatures in a range from about room temperature (e.g., about 20° C.) to less than about 75° C. so as to provide an amorphous conformal coating.

Turning now to the FIGURE, there are shown scanning electron images subsequent to lithographic patterning of an EUV photoresist on a silicon substrate; conformal coating of a metal carboxide onto the patterned EUV photoresist; wet strip removal of the metal carboxide coating; and post etch of the relief pattern formed in the EUV photoresist into a silicon substrate. Advantageously, the post bake resist patterns do not degrade subsequent to deposition of the metal carboxide and the mild etch conditions provided with the wet etch chemistry to remove the metal carboxide as evidenced by the post etch SEM.

The descriptions of the various embodiments of the present invention have been presented for purposes of illustration, but are not intended to be exhaustive or limited to the embodiments of the invention described. Many modifications and variations will be apparent to those of ordinary skill in the art without departing from the scope and spirit of the described embodiments of the invention. The terminology used herein was chosen to best explain the principles of the embodiments of the invention, the practical application or technical improvement over technologies found in the marketplace, or to enable others of ordinary skill in the art to understand the embodiments of the invention described herein.

What is claimed is:

1. A method for preparing a semiconductor wafer with organic extreme ultraviolet sensitive (EUV) photoresist relief images thereon for defect inspection, the method comprising:
   providing a semiconductor wafer having a relief image of an organic EUV sensitive photoresist thereon;
   conformally coating a metal carboxide or a metal carboxynitride onto the relief image using a vapor deposition process at a temperature less than about 100° C. and at a thickness less than about 5 nanometers, wherein the metal carboxide or the metal atomic weight percent and a carbon content greater than 0 atomic weight percent to less than about 20 atomic weight percent; and
   inspecting the wafer using an e-beam inspection tool.

2. The method of claim 1 further comprising removing the metal carboxide or the metal carboxynitride subsequent to inspecting the wafer, wherein removing the metal carboxide or the metal carboxynitride coating comprises exposing the coating to a wet strip process.

3. The method of claim 1, wherein the wet strip process comprises contacting the coating with an aqueous solution comprising ammonium hydroxide and hydrogen peroxide.

4. The method of claim 1, wherein the vapor deposition process comprises a thermal atomic layer deposition process.

5. The method of claim 1, wherein the vapor deposition process comprises a plasma enhanced atomic layer deposition process.

6. The method of claim 1 wherein the metal carboxide or the metal carboxynitride has a dielectric constant greater than about 4.0 and the organic EUV photoresist has a dielectric constant less than about 2.5.

7. The method of claim 1 wherein the metal carboxide or the metal carboxynitride has a dielectric constant greater than about 4.0 and less than about 7.0.

8. The method of claim 1, wherein the metal carboxide or the metal carboxynitride comprises a metal selected from the group consisting of titanium, hafnium, tantalum, cobalt, and tantalum.

9. The method of claim 1, wherein the metal carboxide or the metal carboxynitride coating is amorphous.

10. A method for examining a semiconductor wafer having an organic EUV photoresist relief image thereon using an e-beam inspection tool, the method comprising:
    providing a semiconductor wafer having an organic EUV photoresist relief image thereon;
    conformally coating a metal carboxide or a metal carboxynitride onto the photoresist relief image using a vapor deposition process at a temperature less than about 100° C. and at a thickness less than about 5 nanometers, wherein the metal carboxide or the metal carboxynitride has a metal content from about 15 atomic weight percent to about 30 atomic weight percent and a carbon content greater than 0 atomic weight percent to less than about 20 atomic weight percent, and wherein a dielectric constant of the metal carboxide or the metal carboxynitride is greater than a dielectric constant of the organic EUV photoresist; and
    introducing the wafer into an e-beam inspection tool and scanning the wafer for defect detection.

11. The method of claim 10, wherein the vapor deposition process comprises a thermal atomic layer deposition process.

12. The method of claim 10, wherein the vapor deposition process comprises a plasma enhanced atomic layer deposition process.

13. The method of claim 10, wherein the metal carboxide or the metal carboxynitride comprises a metal selected from the group consisting of titanium, hafnium, tantalum, cobalt, and tantalum.

14. The method of claim 10, wherein the metal carboxide or the metal carboxynitride coating is amorphous.

15. A method for examining a semiconductor wafer having an organic EUV photoresist relief image thereon for defects, the method comprising:

coating an organic EUV photoresist onto a semiconductor wafer at a thickness within a range of about 30 nanometers to about 50 nanometers;
lithographically forming a relief image of the EUV photoresist, wherein the relief image comprises sub-40 nm lines and spaces having a pitch of about 1:1 or less;
conformally coating a metal carboxide or a metal carboxynitride onto the relief image using vapor deposition at a temperature less than about 100° C. and at a thickness less than about 5 nanometers, wherein the metal carboxide or the metal carboxynitride has a metal content from about 15 atomic weight percent to about 30 atomic weight percent and a carbon content greater than 0 atomic weight percent to less than about 20 atomic weight percent;
introducing the wafer in an e-beam tool for inspection and inspecting the semiconductor wafer, wherein inspecting the semiconductor wafer comprises taking an image of a location by scanning the semiconductor wafer with a focused electron beam and comparing the image to a reference image from another wafer location with an identical design, or to a preexisting image stored on a computer, so as to flag differences between the image of the location and the reference image or the preexisting image as a defect; and
wet stripping the metal carboxide or the metal carboxynitride from the relief image.

* * * * *